United States Patent
Inose et al.

(10) Patent No.: US 8,261,427 B2
(45) Date of Patent: Sep. 11, 2012

(54) METHODS FOR MANUFACTURING CRYSTAL DEVICES

(75) Inventors: Naoto Inose, Saitama (JP); Toshiaki Takeuchi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 259 days.

(21) Appl. No.: 12/676,349

(22) PCT Filed: Jul. 3, 2008

(86) PCT No.: PCT/JP2008/001751
§ 371 (c)(1),
(2), (4) Date: Mar. 3, 2010

(87) PCT Pub. No.: WO2009/031258
PCT Pub. Date: Mar. 12, 2009

(65) Prior Publication Data
US 2010/0162545 A1    Jul. 1, 2010

(30) Foreign Application Priority Data
Sep. 3, 2007 (JP) ................................ 2007-227344

(51) Int. Cl.
*H04R 31/00* (2006.01)
(52) U.S. Cl. ............ 29/594; 29/25.35; 29/609.1; 16/13; 16/80; 16/97; 310/319; 310/370; 333/186; 333/187; 333/200
(58) Field of Classification Search ............... 29/25.35, 29/594, 609.1; 310/319, 370; 331/46, 74, 331/154, 156, 158, 116 R, 116 M, 176; 216/13, 216/80, 97; 333/186, 187, 200
See application file for complete search history.

(56) References Cited

U.S. PATENT DOCUMENTS

| | | | | |
|---|---|---|---|---|
| 4,379,244 A | * | 4/1983 | Dinger | 310/312 |
| 6,898,832 B2 | * | 5/2005 | Kawashima | 29/25.35 |
| 6,915,548 B2 | * | 7/2005 | Kawashima | 29/25.35 |
| 6,959,472 B2 | * | 11/2005 | Kawashima | 29/25.35 |

FOREIGN PATENT DOCUMENTS

JP    09-326663    12/1997

(Continued)

OTHER PUBLICATIONS

Office Action for related Japanese Patent Application No. 2007-227344, 3 pages, dated May 10, 2012, (in Japanese; reference list on p. 3).

*Primary Examiner* — Paul D Kim
(74) *Attorney, Agent, or Firm* — Klarquist Sparkman, LLP

(57) ABSTRACT

Crystal devices are disclosed, of which an exemplary device includes a crystal frame comprising a crystal vibrating piece having an electrode pattern and an outer frame supporting the crystal vibrating piece. The device also includes a crystal package base including at least one connection electrode formed on a first main surface and at least one external electrode formed on a second main surface, wherein the second main surface is opposite the first main surface. The crystal frame and crystal base are layered together with a lid wafer to form a 3-layer sandwich. The layers of the sandwich are bonded together by siloxane bonding, which results in the connection electrodes contacting the electrode pattern on the crystal vibrating piece.

22 Claims, 8 Drawing Sheets

FOREIGN PATENT DOCUMENTS

| | | |
|---|---|---|
| JP | 10-022773 | 1/1998 |
| JP | 10-032293 | 2/1998 |
| JP | 10-041771 | 2/1998 |
| JP | 2000-022487 | 1/2000 |
| JP | 2001-119264 | 4/2001 |
| JP | 2003-017965 | 1/2003 |
| JP | 2006-311393 | 11/2006 |
| WO | WO2009/031258 | 3/2009 |

* cited by examiner

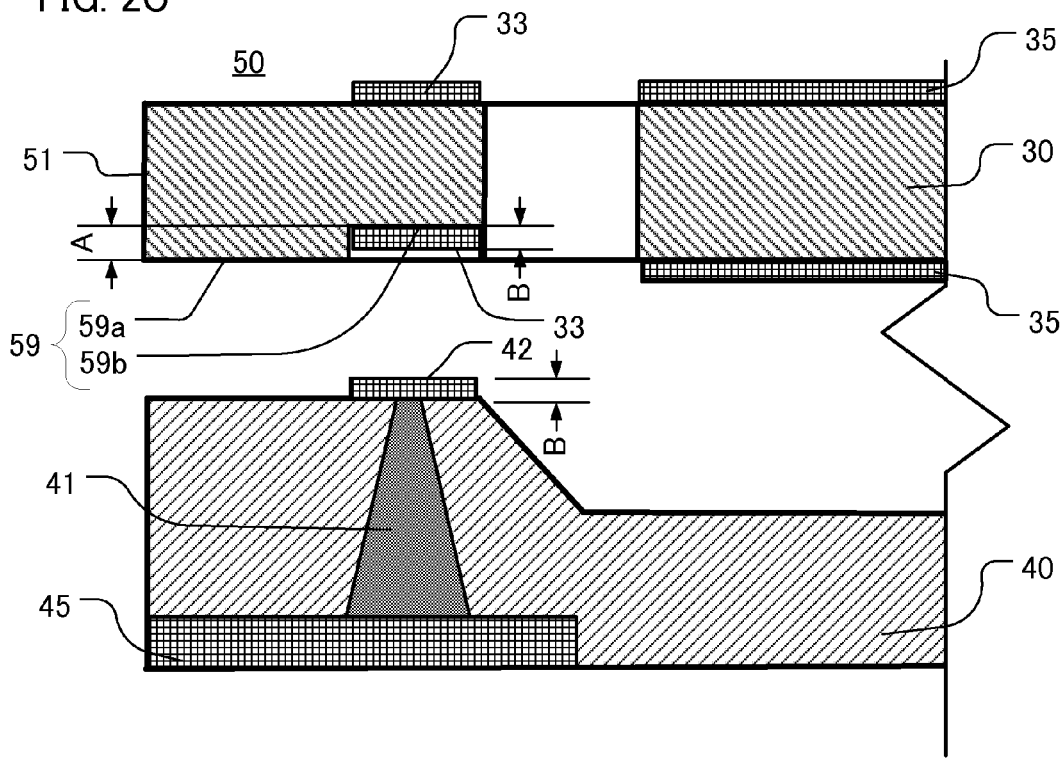
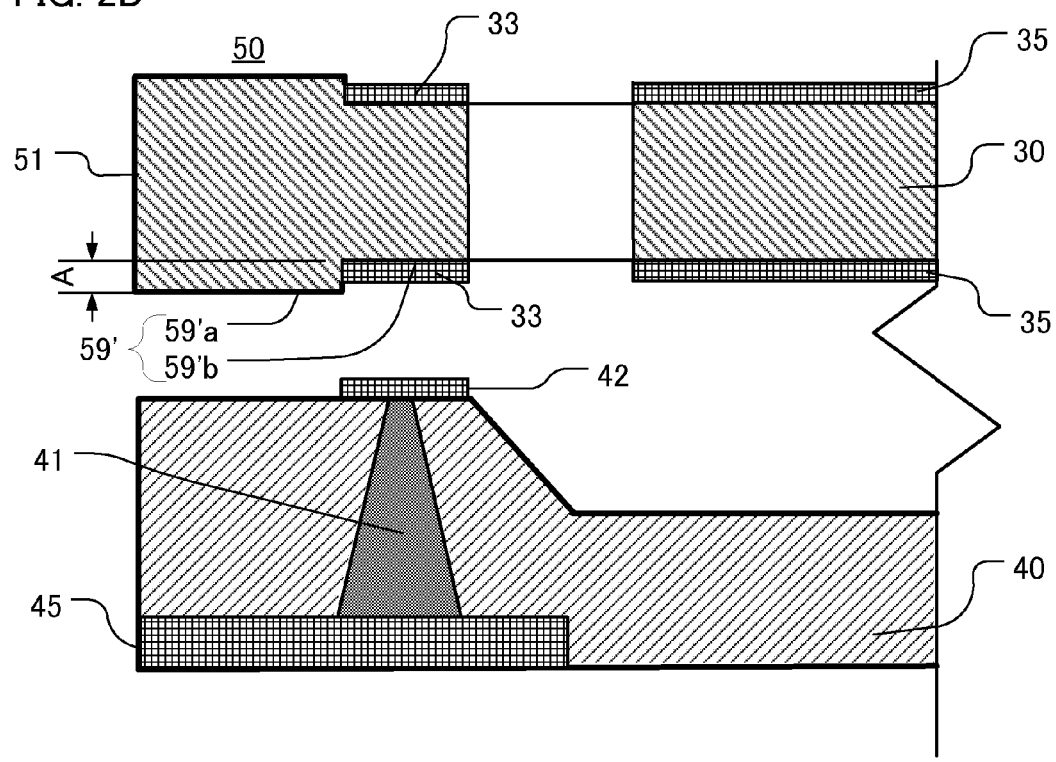

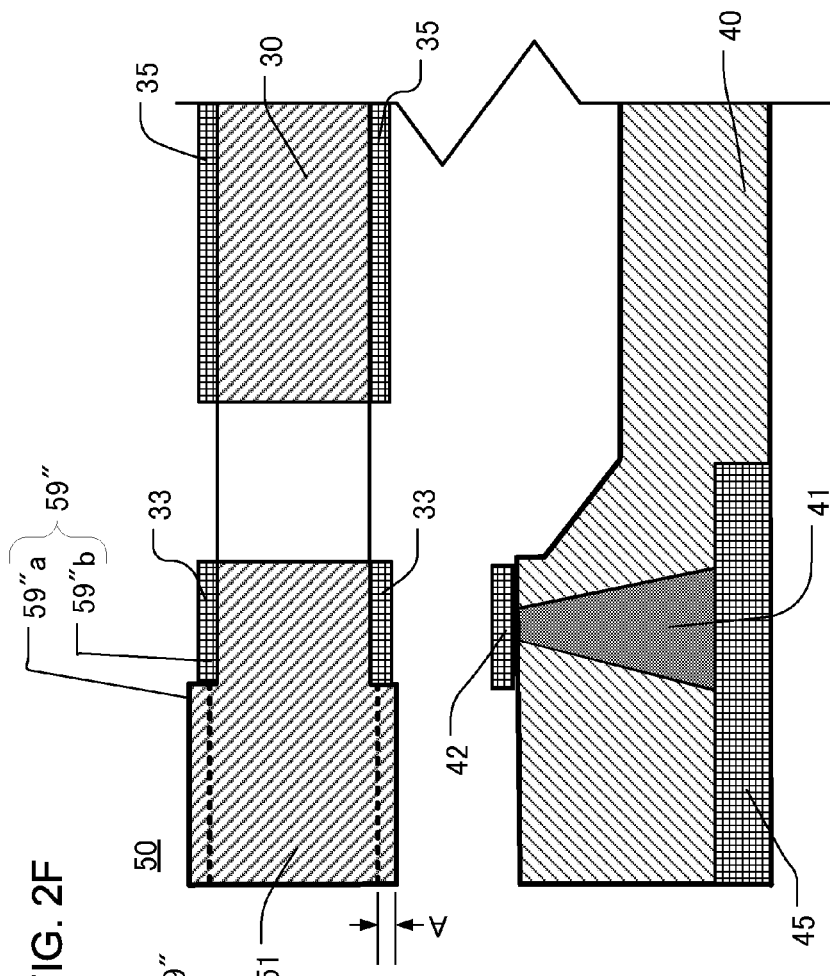
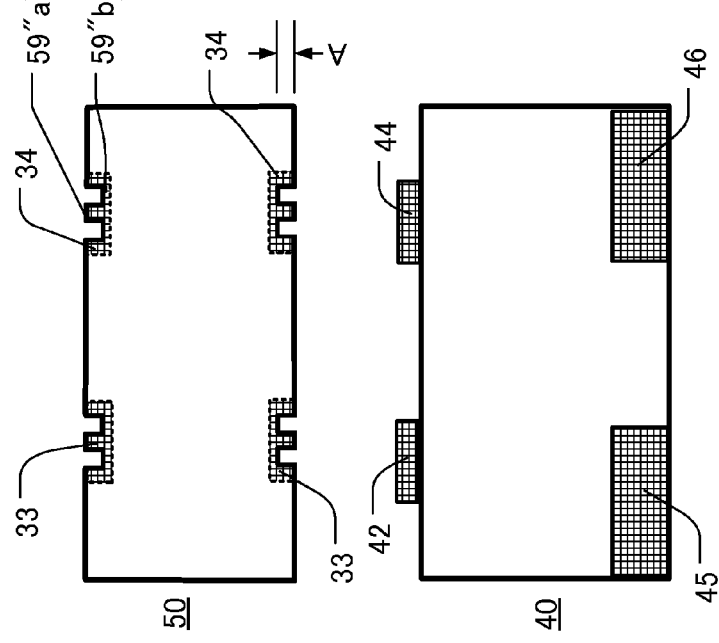
FIG. 2E
FIG. 2F

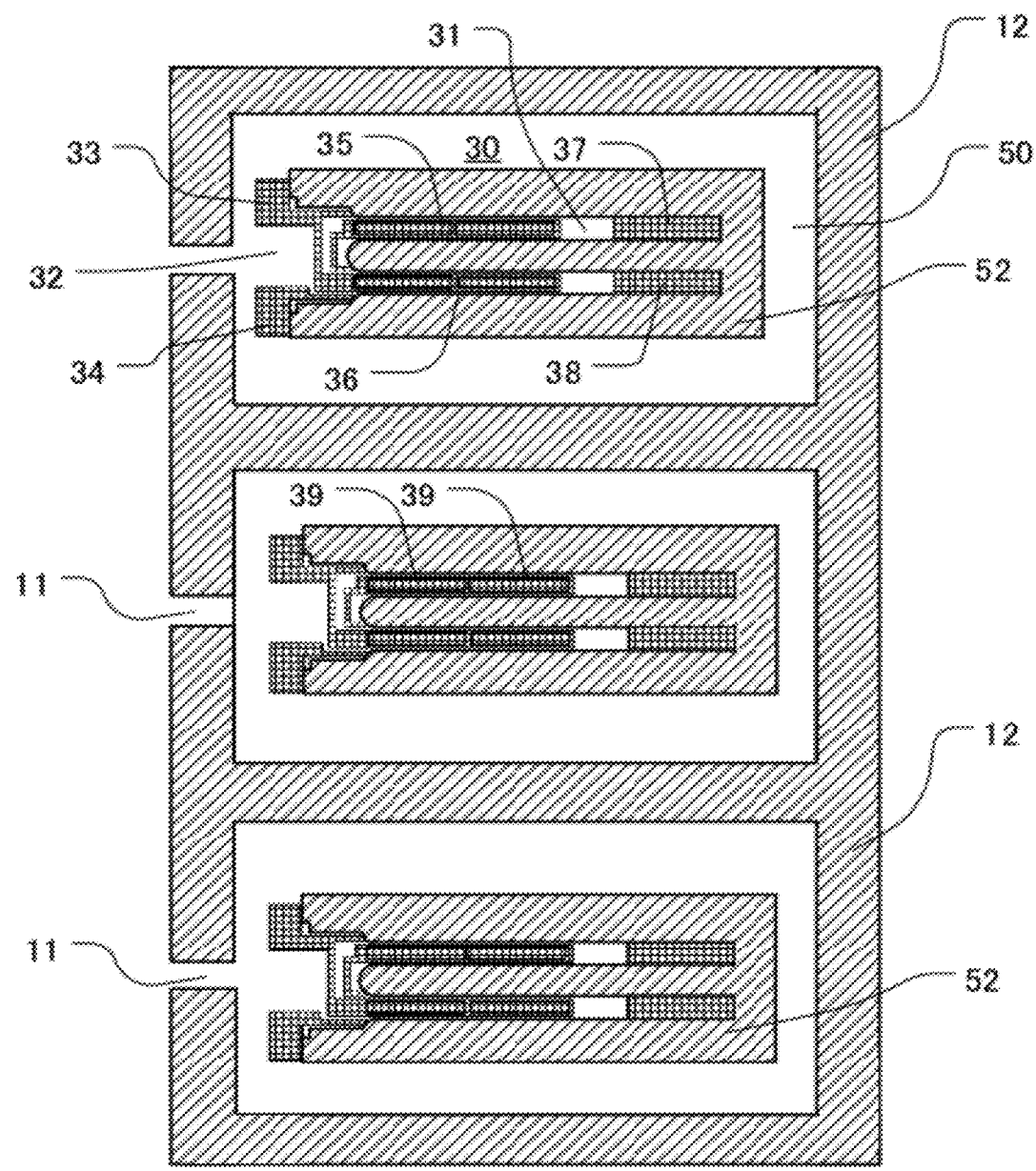

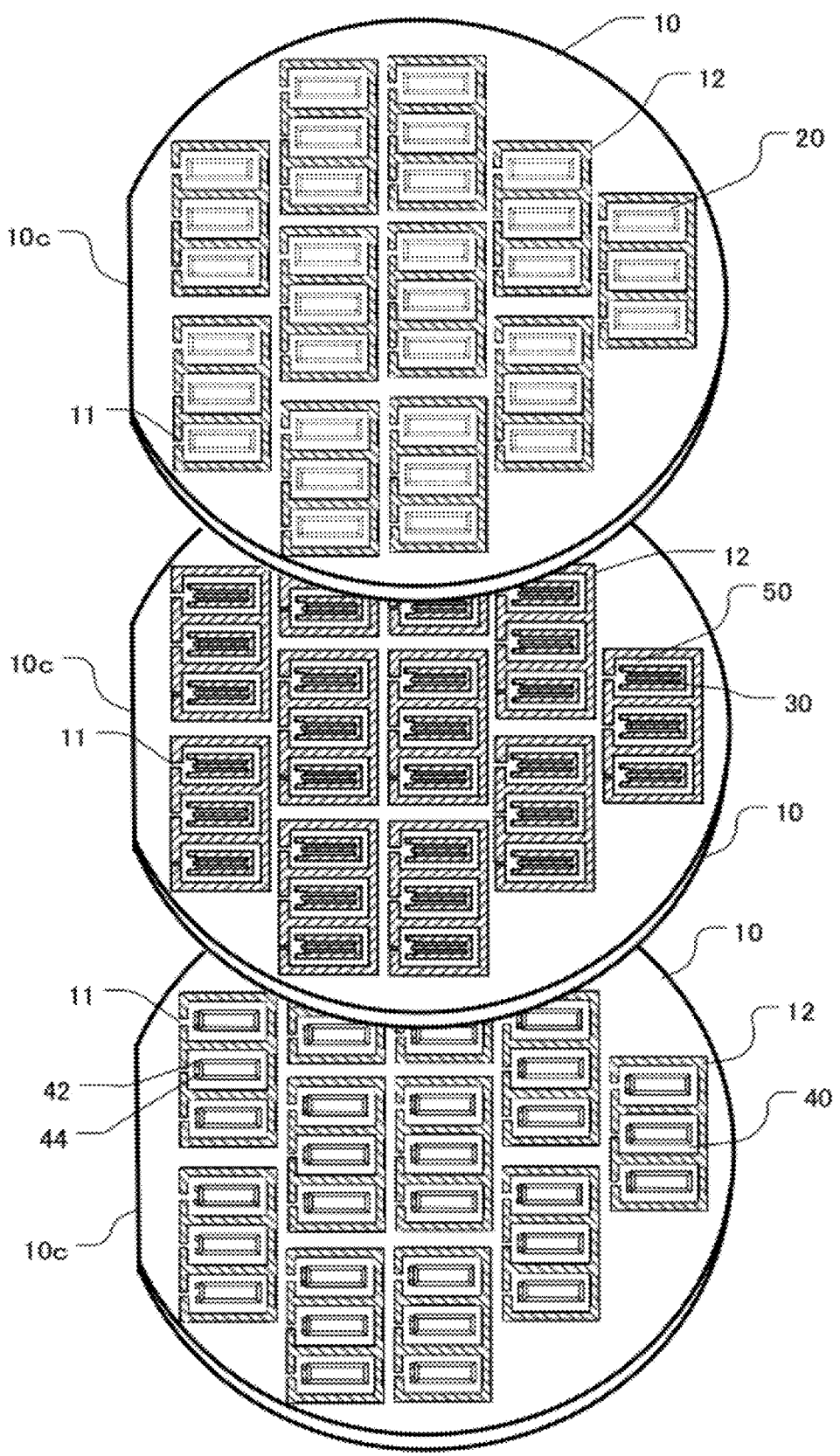

METHODS FOR MANUFACTURING CRYSTAL DEVICES

CROSS REFERENCE TO RELATED APPLICATIONS

This is the U.S. National Stage of International Application No. PCT/JP2008/001751, filed Jul. 3, 2008, which claims priority to and the benefit of JP 2007-227344, filed Sep. 3, 2007, both of which are being incorporated herein by reference in their respective entireties.

FIELD

This disclosure pertains to, inter alia, crystal devices made entirely of crystal material, each device including a lid and a package base that form a respective package around a crystal vibrating piece, and to methods for manufacturing same.

DESCRIPTION OF THE RELATED ART

With the progress of miniaturization and/or increases in the operating frequency of mobile communication apparatus and office automation (OA) equipment, crystal devices used in this equipment must be progressively smaller and/or operate at higher frequency. A conventional crystal device is formed by layering a lid material and a package material comprising glass or ceramic and sealing by anodic bonding in a vacuum state or inert gas atmosphere. Such crystal units as disclosed in Japan Unexamined Patent Application No. Hei 06-343701 are known.

With respect to the crystal unit disclosed in the JP '701 reference, a metal film (e.g., aluminum (Al)) is formed on a glass or ceramic lid in preparation of performing anodic bonding of the lid to form the package. During anodic bonding, the Al film unfortunately may exhibit peeling, which reduces the reliability of the device. Also, the respective coefficients of thermal expansion of aluminum, glass, ceramic, and crystal are sufficiently different from each other that respective material interfaces may become detached by temperature changes. Furthermore, conventional crystal units are typically manufactured individually by layering a glass lid and a package base together piece-by-piece, which makes mass production very difficult.

An object of this invention is to provide a method for manufacturing a crystal device of which the entire package (including package base, lid, and crystal vibrating piece) is formed integrally of a crystal material. This allows all three parts to be bonded together by reliable siloxane bonding (Si—O—Si).

SUMMARY

According to an embodiment, an exemplary crystal device comprises a crystal frame made of a crystal material. The crystal frame has a first main surface and an opposing second main surface. The crystal frame comprises a crystal vibrating piece including an electrode pattern, and also includes an outer frame that surrounds and supports the crystal vibrating piece. The electrode pattern includes at least one excitation electrode and at least one respective extraction electrode. The crystal device further comprises a crystal base ("package base") having at least one connection electrode formed on a "first main surface" (inner main surface) thereof and at least one respective external electrode formed on a "second main surface" (outer main surface) thereof. These two main surfaces oppose each other, and each connection electrode is connected through the package base to a respective external electrode. The crystal frame and the package base are aligned with and layered to each other and bonded together so that each connection electrode becomes bonded to its respective extraction electrode. Thus, each external electrode is connected via its respective connecting electrode and respective extraction electrode to a respective excitation electrode on the crystal vibrating piece. According to this configuration, the electrode pattern and respective connection electrode(s) are reliably bonded together as the outer frame and the package base are being bonded together.

During bonding of the package base to the crystal frame, these components are first placed in contact with each other and aligned so that an initial gap is formed between the inner main surface of the package base and the second main surface of the crystal frame. The gap desirably has a width ("thickness") of 10% to 30% of the thickness of connection electrode plus the thickness of the electrode of the electrode pattern (typically the extraction electrode) contacting the connection electrode. This gap is formed as a result of the connection electrode making contact with the extraction electrode or other electrode of the electrode pattern as the package base and crystal frame are brought together. If the gap is less than 10% of the summed thicknesses of the electrode pattern and of the connection electrode, it is still possible to bond together the frame and base, but the resulting connection(s) between the electrode pattern and the connection electrode(s) may not be sufficient for desired reliability. On the other hand, if the gap is equal to or greater than 30% of the summed thicknesses of the electrode pattern and connection electrode, then the bond between the crystal frame and package base may be insufficient for desired device reliability, regardless of the quality of the connection between the connection electrode(s) and electrode pattern. During siloxane bonding, the gap is reduced to zero as the crystal frame and package base are urged together.

The crystal device desirably includes a crystal lid made of crystal material. The lid is aligned with, layered relative to, and bonded to the first main surface of the outer frame of the crystal frame. In a completed crystal device, the lid, crystal frame, and package base are bonded together by siloxane bonding. By fabricating all three components from crystal materials (desirably the same material), they all have similar coefficients of thermal expansion, which can be very important when the crystal devices are used in environments involving substantial and/or rapid temperature changes. Consequently, cracking and/or peeling that otherwise may be caused by differences of thermal expansion coefficients do not occur in the devices.

In a finished crystal device, the electrode connections between the crystal frame and the package base are very small. Nevertheless, since thermally induced cracking and/or peeling is greatly inhibited by using materials having similar or identical coefficients of thermal expansion, the devices exhibit greater reliability than conventional devices.

In some embodiments the crystal lid has a first concavity in its inner main surface and the package base has a second concavity in its inner main surface. These inner surfaces face each other in the finished device, wherein the crystal vibrating piece is situated between the first and second concavities. This configuration allows appropriate oscillation of the crystal vibrating piece to occur without having to adjust the thickness of the crystal vibrating piece.

Each of the electrodes of the electrode pattern and each connection electrode desirably have a two-metal-layer construction comprising a first metal layer (as a sublayer) and a second metal layer formed on the first metal layer. In the finished device, the second metal layer of the electrode pattern and the second metal layer of the connection electrode(s) are connected together. In devices having such electrode configurations, the respective metals on the crystal frame and on the package base can diffuse together well during the heat and pressure conditions experienced during siloxane bonding.

An embodiment of a method for manufacturing a crystal device configured as summarized above includes the step of forming a crystal frame and the step of forming a package base, both of crystal material. The method includes the step of forming, either on the second main surface of the crystal frame or on the inner main surface of the package base, at least one step portion. Each step portion has a designated height and is situated to serve as a respective electrode-connection site. On each of the first and second main surfaces of the crystal vibrating piece are formed respective electrodes of the electrode pattern, such as excitation and extraction electrodes. Each extraction electrode extends to the outer frame. On the inner main surface of the package base is formed a respective connection electrode for each extraction electrode. One of the following two situations are utilized in the method: (a) each step portion is located on the second main surface of the crystal frame on which a respective connection electrode extends onto the respective step portion, for connection to the respective connection electrode, or (b) each step portion is located on the inner main surface of the package base on which a respective connection electrode extends onto the respective step portion, for connection to the respective extraction electrode. Each step portion has a height that is less than the thickness of the respective extraction electrode plus the thickness of the respective connection electrode. The step portion can be a simple "step" or a more complex step, the latter including, for example, a comb-like shape or a wave-like shape. Comb-like or wave-like shapes are especially effective for forming reliable and durable connections between electrodes during siloxane bonding.

In another method embodiment, multiple crystal lids are formed on a first crystal wafer having first and second main surfaces. Multiple crystal frames are formed on a second crystal wafer having first and second main surfaces, wherein each crystal frame includes a crystal vibrating piece and an outer frame surrounding and supporting the crystal vibrating piece. Each crystal vibrating piece includes at least one excitation electrode and at least one extraction electrode connected to the excitation electrode. Multiple crystal package bases are formed on a third crystal wafer having first and second main surfaces. Each crystal package base corresponds to a respective crystal frame and to a respective lid on the second and first crystal wafers, respectively, to represent a respective crystal device. At least one step portion for each crystal device is formed on the second main surface of the second crystal wafer or on the first main surface of the third crystal wafer. Each step portion has a designated height and is situated to serve as a respective electrode-connection site for the respective crystal device. On the third crystal wafer and for each crystal device, at least one connection electrode is formed on the first main surface, and at least one external electrode, corresponding to the connection electrode, is formed on the second main surface. Either the step portions are located on the second main surface of the second crystal wafer on which the extraction electrodes extend onto respective step portions, or the step portions are located on the first main surface of the third crystal wafer on which the connection electrodes extend onto respective step portions. The step portions each have a height that is less than the thickness of the respective extraction electrode plus the thickness of the respective connection electrode. The first crystal wafer, second crystal wafer, and third crystal are placed relative to and in alignment with each other such that the second crystal wafer is sandwiched between the second main surface of the first crystal wafer and the first main surface of the third crystal wafer. Each lid is aligned with a respective crystal frame, each crystal frame is aligned with a respective package base, and each external electrode is aligned via its respective connection electrode with a respective extraction electrode, while leaving a gap between the second main surface of the second crystal wafer and the first main surface of the third crystal wafer. While maintaining the alignment of the wafers, the wafers are urged together sufficiently to eliminate the gap as the wafers are siloxane bonded together, thereby forming multiple crystal devices. Finally, the crystal devices are detached from the bonded wafers to separate the crystal devices.

These methods allow high productivity of high-reliability crystal devices. High productivity is obtained by forming multiple devices on wafer sandwiches. Also, since the respective coefficients of thermal expansion of all three wafers are substantially equal, siloxane bonding can be conducted easily after aligning the wafers.

In the methods, contact of the electrode pattern with one or more connection electrodes is achieved before contact is made between the second and third crystal wafers. Further urging together of the wafers during siloxane bonding further strengthens the electrode connections while achieving good bonding between all three wafers. Thus, bonding between electrodes and bonding between wafers occur simultaneously.

Since the lids and package bases of the crystal devices are made of crystal material (as is the crystal frames), manufacture of the devices is simple and easy. Also, since the electrodes are all bonded together at the same time, mass production is easily achieved, with concomitant reductions in item cost.

BRIEF DESCRIPTION OF THE DRAWINGS

FIG. 2C is an enlarged elevational section of a portion of the crystal frame 50 and the package base 40 of a second embodiment, wherein the frame and package base are depicted vertically separated from each other.

FIG. 2D is an enlarged elevational section of a portion of the crystal frame 50 and the package base 40 of a third embodiment, wherein the frame and package base are depicted vertically separated from each other.

FIG. 2E is an orthogonal side elevational view of the crystal frame 50 and the package base 40 of a fourth embodiment.

FIG. 2F is an enlarged elevational section of a portion of the crystal frame 50 and the package base 40 of the fourth embodiment, wherein the frame and package base are depicted vertically separated from each other.

FIG. 3B is an enlarged plan view of a portion of the crystal wafer 10 including three crystal frames 50.

FIG. 4 is a perspective view of a crystal wafer 10 on which lids 20 have been formed, a crystal wafer 10 on which tuning-fork type crystal vibrating pieces 30 and respective crystal frames 50 have been formed, and a crystal wafer 10 on which package bases 40 have been formed. This figure also depicts the manner in which the three wafers are brought into registration with each other and layered together to form a three-wafer sandwich, in a step of an embodiment of a process for manufacturing crystal units.

DETAILED DESCRIPTION

First Embodiment of Crystal Unit 100

Figure 1A:
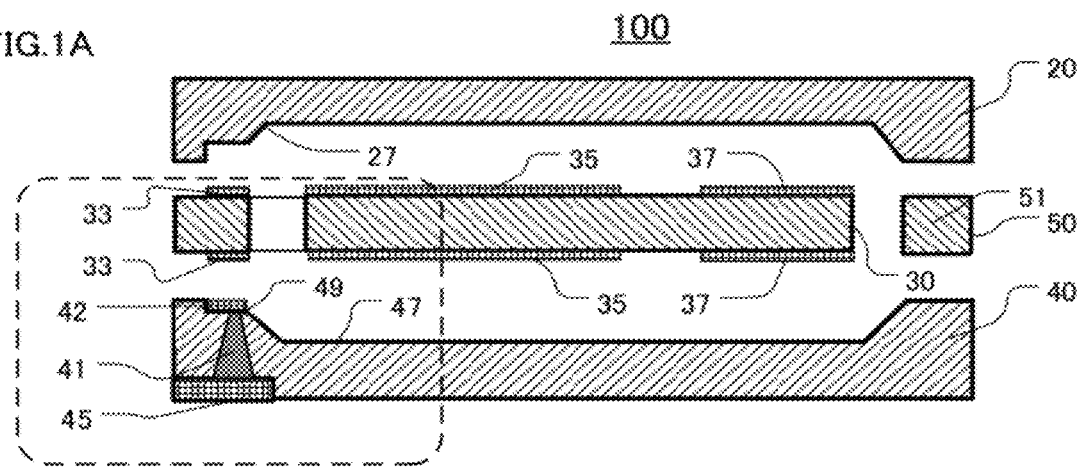
FIG. 1A is an elevational section of a first embodiment of a crystal unit 100, along the line X-X in FIG. 1B.
Figure 1B:
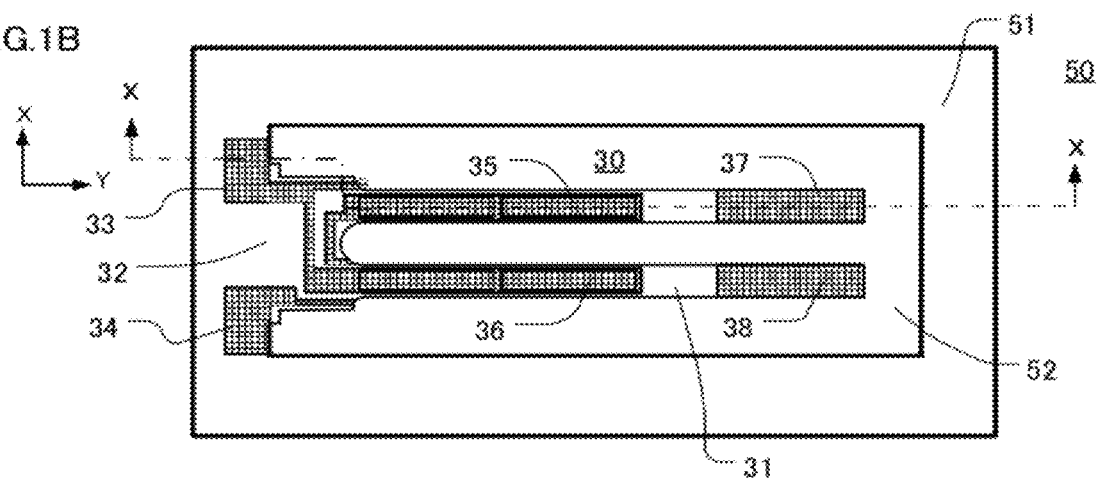
FIG. 1B is a plan view of the crystal frame 50 of the embodiment shown in FIG. 1A.
Figure 1C:
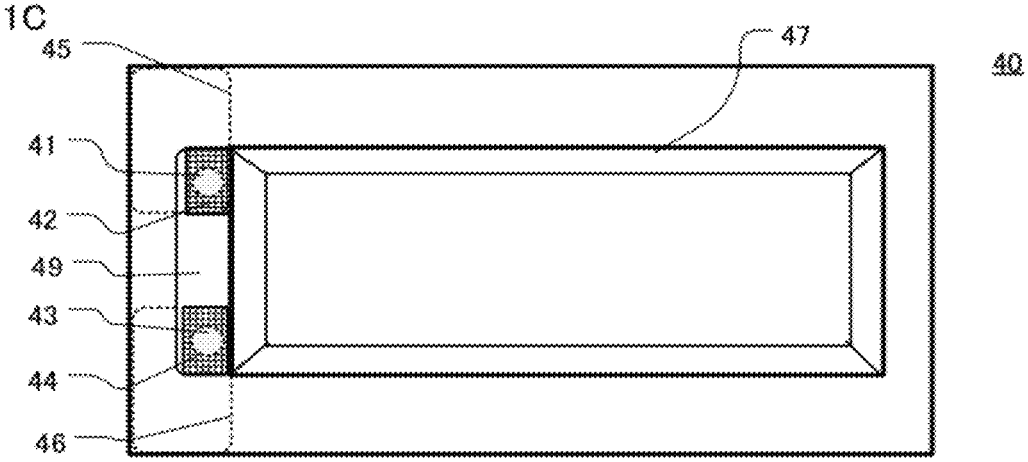
FIG. 1C is a plan view of the package base 40 of the embodiment of FIG. 1A.

Various embodiments of a crystal unit 100 according to the present invention are described below with reference to the accompanying figures. With respect to this first embodiment, FIG. 1A is an elevational section along the line X-X in FIG. 1B, showing the configuration of the crystal unit 100. This figure includes elevational sections of the lid 20, the crystal frame 50, and package base 40 that are depicted with some vertical separation from each other to indicate their respective positions before being bonded together. FIG. 1B is a plan view of the crystal frame 50, and FIG. 1C is a plan view of the package base 40.

As shown in FIG. 1A, the crystal unit 100 of this embodiment comprises a top portion ("lid") 20, a bottom portion ("package base") 40, and a middle portion ("crystal frame") 50. The lid 20, package base 40, and crystal frame 50 are made from respective crystal wafers. The lid 20 includes a concavity 27, formed by etching, that faces the crystal frame 50 from above. The package base 40 includes a concavity 47, formed by etching, that faces the crystal frame 50 from below. The crystal frame 50 includes a tuning-fork type crystal vibrating piece 30, formed by etching. The lid 20 is attached, by bonding, to the upper major surface of the crystal frame 50, while the package base 40 is attached, by bonding, to the lower major surface of the crystal frame 50. Thus, the crystal frame 50 (with the crystal vibrating piece 30) is sandwiched between the lid 20 and the package base 40, thereby forming the crystal unit 100. (A "crystal unit," then, is a crystal vibrating piece enclosed in a package comprising the lid 20, the package base 40, and crystal frame 50.) Desirably, the lid 20 and package base 40 are bonded to the crystal frame 50 by siloxane bonding (Si—O—Si).

As shown in FIG. 1B, the crystal frame 50 includes a tuning-fork type crystal vibrating piece 30 mounted to an outer frame 51 such that the outer frame 51 surrounds the vibrating piece 30. A space 52 exists between the tuning-fork type crystal vibrating piece 30 and the outer frame 51. The space 52 is complementary to the outline profile of the tuning-fork type crystal vibrating piece 30, and is formed by etching of the crystal material. The tuning-fork type crystal vibrating piece 30 comprises a base portion 32 and a pair of vibrating arms 32 longitudinally extending from the base portion 32 in a designated direction (Y-direction in the figure). The base portion 32 and the outer frame 51 are formed integrally. On respective first main surfaces of the base portion 32 and the outer frame 51 are formed a first extraction electrode 33 and a second extraction electrode 34. Similarly, on respective second main surfaces of the base portion 32 and the outer frame 51 are formed a first extraction electrode 33 and a second extraction electrode 34.

On a first main surface and a second main surface of the crystal vibrating piece 30 are formed a first excitation electrode 35 and a second excitation electrode 36. The first excitation electrode 35 is connected to the first extraction electrode 33. The second excitation electrode 36 is connected to the second extraction electrode 34. The vibrating arms 31 of the crystal vibrating piece 30 have respective distal ends on which respective "weights" 37, 38 are formed. The first extraction electrode 33, the second extraction electrode 34, the first excitation electrode 35, the second excitation electrode 36, the weight 37, and the weight 38 are all formed simultaneously in a photolithography-etching step. Whenever a voltage is applied to the excitation electrodes the crystal vibrating piece 30 oscillates at a designated frequency. The weights 37, 38 allow the vibrating arms 31 to oscillate easily and allow adjustment of the frequency at which the vibrating arms oscillate.

As shown in FIG. 1C, the concavity 47 is formed on the inner main surface of the package base 40 by etching. During that etching step, a first through-hole 41, a second through-hole 43, and a step portion 49 are also formed. The package base 40 comprises a first connection electrode 42 and a second connection electrode 44. The first connection electrode 42 and the second connection electrode 44 are formed on the step portion 49.

Formed on the inner surfaces of the first and second through-holes 41, 43 is a metal film. The metal film is formed as the first and second connection electrodes 42, 44 are formed in the photolithography step. The package base 40 is provided with a first external electrode 45 and a second external electrode 46 that are metalized on the bottom (outer) main surface of the package base. The first connection electrode 42 is connected to the first external electrode 45 via the first through-hole 41. The second connection electrode 44 is connected to the second external electrode 46 via the second through-hole 43.

As noted above, the lid 20, package base 40, and crystal frame 50 are bonded together desirably by siloxane bonding. In preparation for bonding, the crystal frame 50 (including the crystal vibrating piece 30) is sandwiched between the package base 40 and the lid such that the concavity 47 in the package base and the concavity 27 in the lid 20 face each other as well as the crystal vibrating piece 30. To facilitate bonding the bonding surfaces of the lid and package base are cleaned. The crystal frame 50 is sandwiched between the lid 20 and package base 40, and the resulting sandwich is placed in a high-temperature furnace at 400° C. to 450° C. as required for forming the bonds, thereby yielding a packaged crystal unit.

The concavities 27, 47 are formed on the lid 20 and the package base 40 respectively, in this embodiment. However, in some alternative configurations, one or both concavities can be omitted. In an exemplary alternative configuration, respective spaces are formed between the lid 20 and the crystal vibrating piece 30, and between the package base 40 and the crystal vibrating piece 30, to avoid interferences in the oscillation of the crystal vibrating piece 30. More specifically, if the crystal vibrating piece 30 of the crystal frame 50 is made thinner than the crystal frame 50, the lid 20 and the package base 40 need not have the concavities. For example, the package can have an overall tabular shape. However, to perform siloxane bonding of the lid 20, the package base 40, and the crystal frame 50 while concurrently forming connections of the first and the second extraction electrodes 33, 34 with the first and the second connection electrodes 42, 44, respectively, a step portion 49 are formed on the base 40 of this embodiment, as described below.

After completion of siloxane bonding, the first through-hole 41 and the second through-hole 43 are filled with a gold-tin (Au—Sn) alloy or a gold-silicon (Au—Si) alloy, as representative sealing alloys. Alternatively, gold or silver formed by sintering gold paste or silver paste, respectively, can be used. Melting of the sealing alloy can be performed in a vacuum-reflow furnace (under a vacuum) or in a vacuum-reflow furnace filled with an inert gas. Furnace temperature depends upon the type of alloy being used. By way of example, using a conventional gold-tin (Au—Sn) alloy, the temperature of the reflow furnace is usually approximately 300° C. because the melting point of the gold-tin alloy is 280° C. In another example in which gold-silicon (Au—Si) alloy is used, the reflow furnace is approximately 380° C. because the melting point of the gold-silicon alloy is 363° C. Thus, a crystal unit 100 is formed in which the interior of the package is at a particular vacuum level or contains a desired pressure of an inert gas.

Since the lid 20, the crystal vibrating piece 30, and the package base 40 are each made of a crystal material (e.g., quartz crystal), their coefficients of thermal expansion are substantially similar. In conventional crystal units, these parts are made of different respective materials, which may allow undesirable fractures to occur along the bond lines due to the materials' different respective coefficients of thermal expansion. In this embodiment, in contrast, the lid, package base, and crystal vibrating piece are made of the same material, which eliminates fractures along bond lines even if the crystal unit 100 is placed in an environment in which the temperature experiences substantial and/or rapid change.

First Embodiment of Method for Bonding Crystal Parts and Electrodes

Figure 2A:
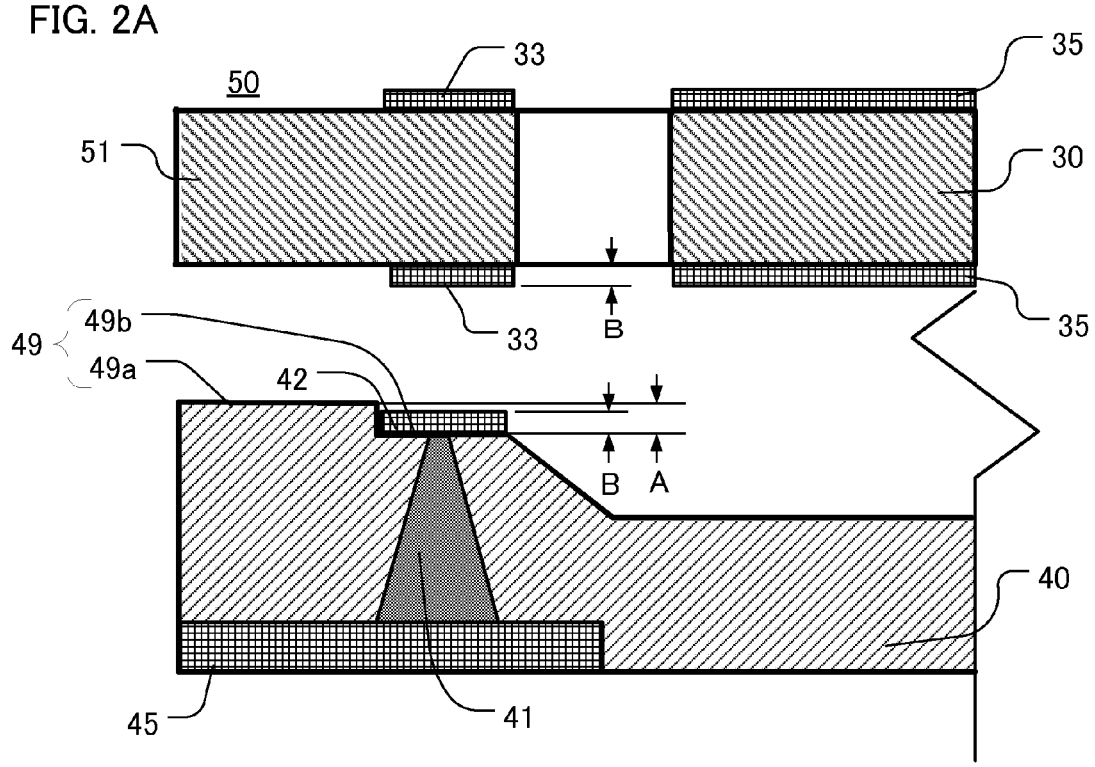
FIG. 2A is an enlarged elevational section of a portion of the crystal frame 50 and the package base 40 of the first embodiment, wherein the frame and package base are depicted vertically separated from each other.
Figure 2B:
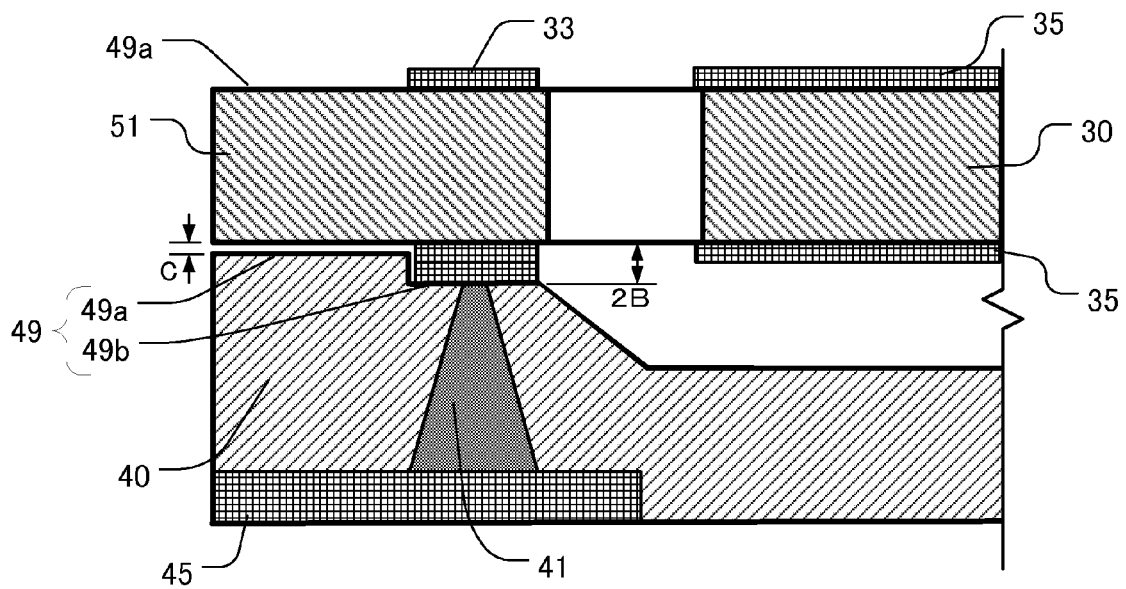
FIG. 2B is an enlarged elevational section of a portion of the crystal frame 50 and the package base 40 of first embodiment after layering the frame onto the package base.

FIGS. 2A and 2B are enlarged elevational sections of the crystal frame 50 and package base 40 of the first embodiment. FIG. 2A shows the crystal frame 50 and package base 40 vertically separated from each other. FIG. 2B shows a corresponding portion of the crystal frame 50 layered onto the package base 40, but not yet bonded together by siloxane bonding.

Figure 2G:
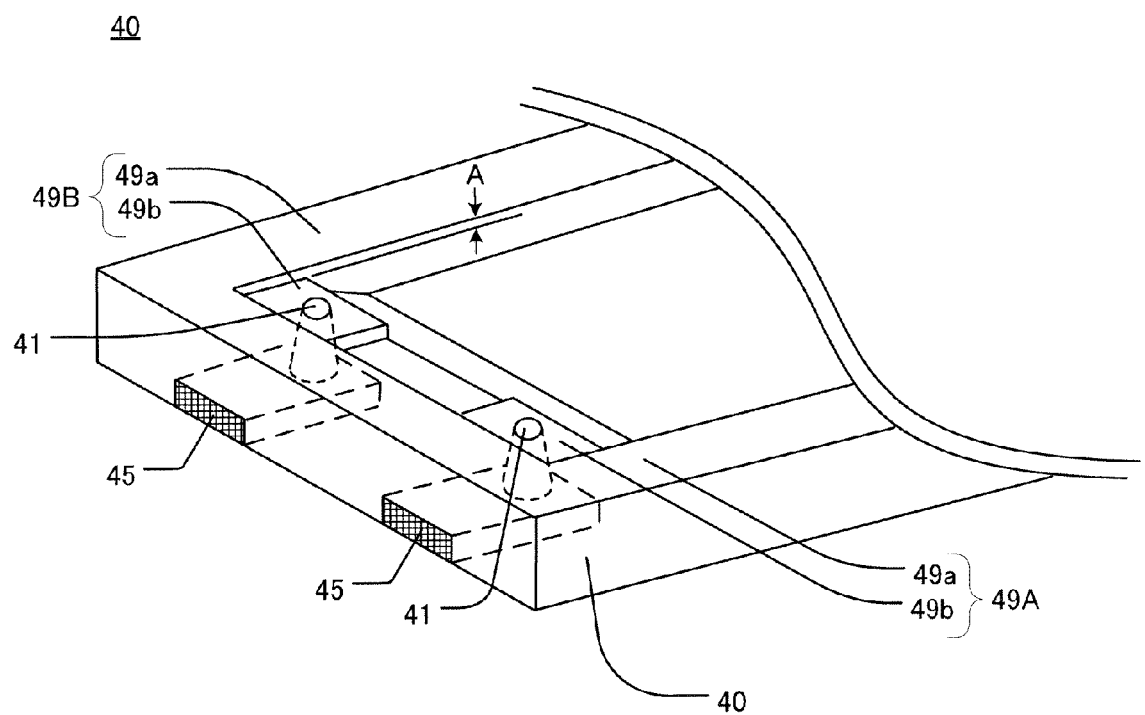
FIG. 2G is an oblique view of the portion of the package base shown in FIG. 2B, depicting the two step portions.

In FIGS. 2A and 2B, at locations where the first connecting electrode 42 and the second connecting electrode 44 (see FIG. 1C) are formed on the package base 40, a respective step portion 49 is formed. See FIG. 2G, which shows two step portions 49A, 49B. Each step portion 49A, 49B includes a respective first step 49a and a respective second step 49b. The second step 49b is formed by wet etching and has a depth of 2500 Å to 3000 Å relative to the first step 49a. The thickness B of each of the first extraction electrode 33 and of the second extraction electrode 34 (not illustrated) is 1500 Å to 2000 Å. The thickness B of each of the first connection electrode 42 and second connection electrode 44 is also 1500 Å to 2000 Å. That is, sum of the thicknesses of the extraction electrode formed on the crystal frame 50 and of the connection electrode formed on the package base 40 is 3000 Å to 4000 Å (2×B).

When the package base 40 and the crystal frame 50 are layered to each other, the first and the second extraction electrodes 33, 34 initially touch the first and second connection electrodes 42, 44, respectively. In this condition, a space C between the lower surface of the crystal frame 50 and the upper surface of the package base 40 is about 500 Å to 1000 Å. When siloxane bonding is performed in this condition, respective gold layers of the first extraction electrode 33 and first connection electrode 44, and of the second extraction electrode 34 and second connection electrode 44 are bonded, respectively. By putting pressure on the crystal frame 50 and the package base 40 during bonding, the space C disappears. As a result, the lower surface of the crystal frame 50 and the upper surface of the package base 40 are bonded strongly together by siloxane bonding.

If one attempts to bond together the lower surface of the crystal frame 50 to the upper surface of the package base 40 without foaming the step portions 49, the frame and base may not actually bond together because the thickness of the extraction electrode on the crystal frame 50 plus the thickness of the connection electrode formed on the base 40 is 3000 Å to 4000 Å, which (FIG. 2B) prevents sufficient bonding contact of the package base 40 and crystal frame 50. On the other hand, if the step portion 49 is formed having a depth equal to or greater than the sum of thickness of the extraction electrode and thickness of the connection electrode (3000 Å to 4000 Å), the crystal frame 50 and the package base 40 can still be bonded together but the bonding does not include the first and second extraction electrodes 33, 34 to the first and second connection electrodes 42, 44, respectively. This results in these electrodes not being properly connected to each other in a conductive manner.

Therefore, the second step 49b is formed with depth A relative to the first step 49a (FIG. 2A), which is 10% to 30% thinner than the thickness of the first plus the thickness of the second extraction electrodes 33, 34 and first and second connection electrodes 42, 44, respectively. Whenever the difference between the depth of the second step 49b and the thickness of the extraction electrode plus connection electrode is 0% to 10% the depth of the second step, the extraction electrode and connection electrode may not become bonded to each other in most cases. Whenever the difference of these depths is equal to or less than 30% the depth of the second step 49b, it may not be possible to bond the crystal frame 50 and package base 40 together in most cases.

Second Embodiment

FIG. 2C is an enlarged elevational section of the crystal frame 50 and package base 40 of a second embodiment. On the lower surface of the crystal frame 50, a step portion 59 (configured as a depression and including a first step 59a and a second step 59b), is situated where the first extraction electrode 33 and second extraction electrode 34 (see FIG. 1C) are formed. The first step 59a is a respective portion of the lower main surface of the crystal frame (FIG. 2C). The depth A of the second step 59b relative to the first step 59a is 2500 Å to 3000 Å. The thickness B of each of the first and the second electrodes 33, 34, and of plus each of the first and second connection electrodes 42, 44, respectively, is 1500 Å to 2000 Å, so that the total thickness of each pair of these electrodes (33, 42 and 34, 44) is 3000 Å to 4000 Å. The difference between the total thickness (2×B) of a pair of electrodes and the depth A of the step portion 59 is a space C (FIG. 2B) having a thickness of 500 Å to 1000 Å. By maintaining the space C in this manner, the first and the second extraction electrodes 33, 34 are reliably connected to the first and second connection electrodes 42, 44, respectively. Upon application of compressive force to the crystal frame 50 and package base 40, the space C disappears as the crystal frame and package base are bonded together strongly by siloxane bonding.

Third Embodiment

FIG. 2D is an enlarged elevational section of a portion of the crystal frame 50 and package base 40 of a third embodiment. On the lower surface of the crystal frame 50 stepped projections 59' are formed (only one is shown). Each stepped projection 59' includes a respective first step 59'a and a respective second step 59'b. Each stepped projection 59' is formed where the first extraction electrode 33 and second extraction electrode 34 (see FIG. 1C), respectively, are formed. The height A of the second step 59'b relative to the height of the lower main surface of the crystal frame 50 (i.e., the first step 59'a) is 2500 Å to 3000 Å. The total thickness of an extraction electrode and corresponding connection electrode is 3000 Å to 4000 Å. The difference in total electrode thickness (2×B) and the depth A is a space C having a height of 500 Å to 1000 Å. By maintaining the thickness of the space C in this manner, the first and second extraction electrodes 33, 34, are reliably connected to the corresponding first and second connection electrodes 42, 44. Upon application of compressive force on the crystal frame 50 and base 40, the space C disappears as the crystal frame and package base are bonded strongly together by siloxane bonding.

Fourth Embodiment

FIG. 2E is a side elevational view of the crystal frame 50 and package base 40 of this embodiment. FIG. 2F is an enlarged elevational section of a portion of the frame and package base. The total thickness of an extraction electrode and corresponding connection electrode is 3000 Å to 4000 Å. The depth A of the step portion 59" of this embodiment (i.e., the difference in height of the second step 59"b relative to the first step 59"a is 2500 Å to 3000 Å, as in the third embodiment. However, in each step portion 59", respective first and second steps 59"a and 59"b of this embodiment are each comb-shaped, and portions thereof have zero depth from the lower main surface of the package base. With such a step portion 59", the first and second extraction electrodes 33, 34 are reliably connected to respective first and second connection electrodes 42, 44. By applying compressive force on the crystal frame 50 and the package base 40, the space C disappears as the crystal frame and package base are bonded strongly together by siloxane bonding.

The fourth embodiment as shown in FIGS. 2E and 2F includes the comb-shaped steps 59"a, 50"b of the step portion 59" formed on the outer frame portion 51 of the crystal frame 50. It will be understood that the step portion 59" can be formed substantially anywhere on the package base 40. Also, in alternative configurations the step portion can be waveform-shaped instead of comb-shaped. A waveform-shaped step portion has regions in which the depth from the lower main surface of the package base is zero depth, and other regions in which the depth (500 Å to 1000 Å) is less than the total thickness of an extraction electrode and corresponding connection electrode (2×B).

Figure 3A:
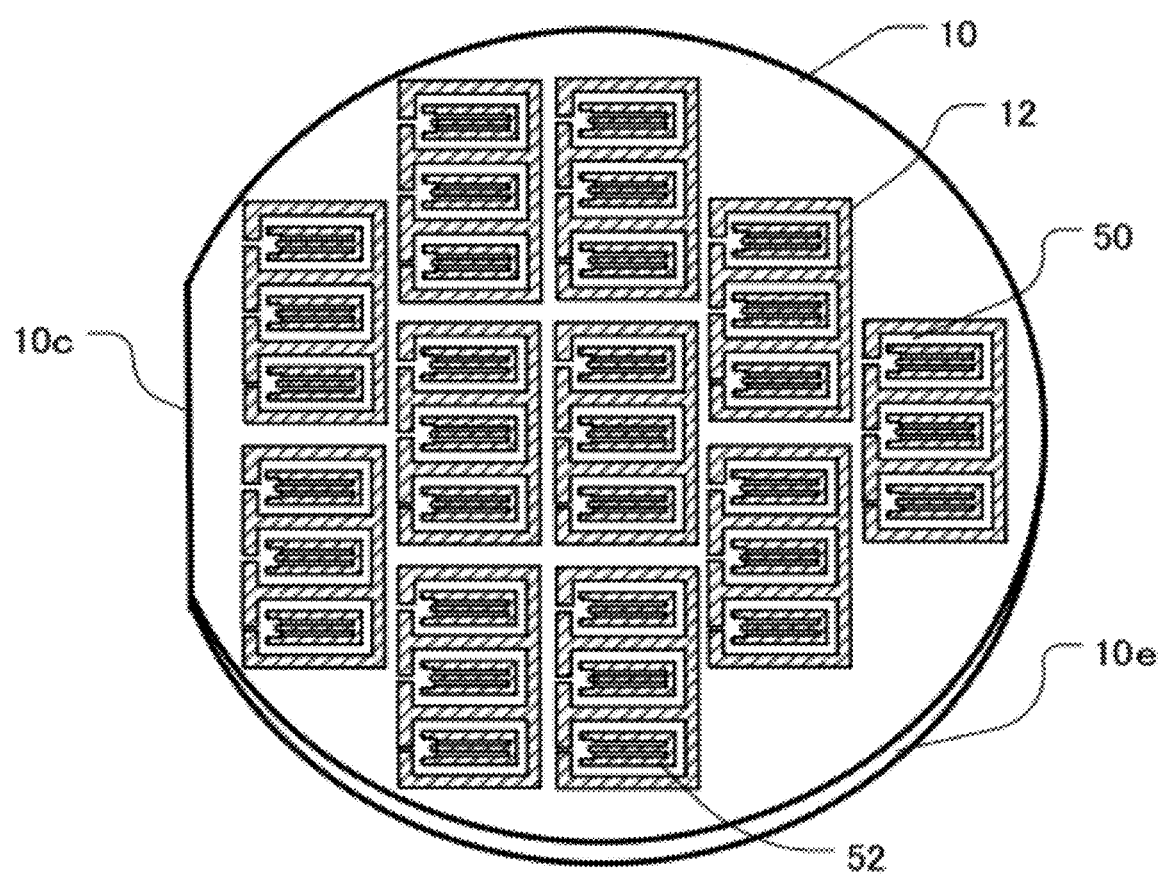
FIG. 3A is a simplified perspective view of a crystal wafer 10 on which a plurality of tuning-fork type crystal vibrating pieces 30 have been formed.

Embodiment of Method for Manufacturing Crystal Frame and Tuning-Fork Type Crystal Vibrating Piece FIG. 3A is a simplified perspective view of a crystal wafer 10 on which multiple tuning-fork type crystal vibrating pieces 30 have been formed. The tuning-fork type crystal vibrating pieces 30 and respective crystal frames 50 are formed concurrently by etching of a circular crystal wafer 10. Etching produces the openings 12 and spaces 52, which are shown as shaded areas. The openings and spaces dictate the size and shape of the tuning-fork type crystal vibrating pieces 30 and respective crystal frames 50. FIG. 3A shows that the tuning-fork type crystal vibrating pieces 30 with their respective crystal frames 50 are formed in groups of three, and eleven such groups are shown. The crystal wafer 10 includes an orientation flat 10c on its periphery 10e that defines the lattice direction of the crystal. For convenience of in this description, only thirty-three tuning-fork type crystal vibrating pieces 30 are shown on the single crystal wafer 10. But, it will be understood that, during actual manufacture, hundreds or thousands of tuning-fork type crystal vibrating pieces 30 are formed on a single crystal wafer.

In FIG. 3A, the tuning-fork type crystal vibrating piece 30 and the crystal frame 50 are not completely detached from the crystal wafer 10; a part of each crystal frame 50 is connected to the crystal wafer 10. Thus, the crystal frames 50 are not produced individually, but rather in large groups on the crystal wafer 10.

FIG. 3B is an enlarged plan view of a portion of the crystal wafer 10 including three crystal frames 50. The opening 12 (shaded area) is formed having certain predetermined dimensions that determine the size and shape of the tuning-fork type crystal vibrating pieces 30 and crystal frames 50 actually produced. The connecting portion 11 extends from one peripheral region of the crystal frame 50. The connecting portion 11 connects together the crystal wafer 10 and the crystal frame 50 to enable a plurality of crystal frames 50 to be handled and processed simultaneously. The space 52 also defines the outline profile of the crystal vibrating piece 30, and is formed by etching at the time the opening 12 is formed.

On the crystal vibrating piece 30 as connected to the crystal wafer 10, the first extraction electrode 33 and second extraction electrode 34, the first excitation electrode 35 and second excitation electrode 36, and the weight portions 37, 38 are formed. Also, grooves 39 are formed on the main surfaces of each vibrating arm 31. The grooves 39 extend from the base portion 32 in the longitudinal direction. The first excitation electrode 35 and second excitation electrode 36 also extend into the grooves 39 to facilitate lowering the CI (Crystal Impedance) value of the vibrating piece 30.

The extraction electrodes 33, 34, the excitation electrodes 35, 36, and the weight portions 37, 38 are formed on the crystal vibrating piece 30 by photolithography performed after forming a metal film by sputtering or vacuum deposition. Specifically, each extraction electrode is a double-layered metal film such as a gold (Au) layer or silver (Ag) layer formed on a sublayer of chromium (Cr), nickel (Ni), or titanium (Ti) formed by sputtering, for example. In this embodiment the thickness of the sublayer (e.g., Ni) is 500 Å to 1000 Å, the thickness of the gold layer is 500 Å to 1000 Å. Thus, the total thickness of the first extraction electrode 33 with first excitation electrode 35, and the total thickness of the second extraction electrode 34 with second excitation electrode 36 is 1500 Å to 2000 Å.

Method for Manufacturing Tuning-Fork Type Crystal Unit 100

FIG. 4 shows a manner in which the crystal wafer 10 (upper wafer) on which lids 20 are formed, the crystal wafer 10 (middle wafer) on which the tuning-fork type crystal vibrating pieces 30 and respective crystal frames 50 are formed, and the crystal wafer 10 (lower wafer) on which package bases 40 are formed are arranged as the wafers are registered with each other to form a 3-layer sandwich. In the sandwich, each wafer 10 has multiple connecting portions 11 that connect the respective lid 20, package base 40, and crystal frame thereto.

At time of forming the sandwich, the concavity 27 has already been formed on the inner major surface of the lid 20 by crystal etching. Also, the concavity 47 has already been formed on the inner major surface of the package base 40 by crystal etching. Also already formed are the first and second connection electrodes 42, 44. As shown in FIGS. 3A and 3B, respective first and second extraction electrodes 35, 36 are already formed on each tuning-fork type crystal vibrating piece 30. Also pre-formed are the first and second extraction electrodes 33, 34 and the first and second excitation electrodes 35, 36.

Exemplary crystal wafers 10 are four inches in diameter. Each set of three wafers (for making a wafer sandwich) are oriented and registered with each other accurately using the orientation flat 10c. As explained above in connection with FIGS. 2A, 2B, and 2C, the first and second extraction electrode 33, 34 are strongly bonded to the first and second connection electrodes 42, 44 at the time when the respective crystal wafers 10 are bonded together by siloxane bonding.

After the three crystal wafers 10 are layered and bonded together in the sandwich, production of individual crystal units 100 is completed by cutting the connecting portions 11. Thus, so-called packaging and bonding of electrodes can be conducted at the same time. Also, by conducting manufacture on the wafer level, multiple crystal units can be produced simultaneously and hence economically and efficiently.

Representative embodiments are described above. It will be understood that these embodiments can be modified or changed while not departing from the spirit and scope of them and/or of the appended claims. For example, the through-holes desirably are filled using a filling material such as AuSn, AuSi, or Au paste. Alternatively, $Au_{12}Ge$ or other metal alloy having a melting point of 300° C. to 400° C. can be used for achieving the same result.

Also, whereas the foregoing discussion was made in the context of a tuning-fork type crystal vibrating piece 30, this is not intended to be limiting. In alternative embodiments, the tuning-fork type crystal vibrating piece is replaced with an AT vibrating piece or a SAW element using a crystal board.

What is claimed is:

1. A method for manufacturing a crystal device, comprising:
   forming a crystal frame of a crystal material, the crystal frame including a first main surface and a second main surface, a crystal vibrating piece, and an outer frame surrounding and supporting the crystal vibrating piece;
   forming a package base of a crystal material, the package base including inner and outer main surfaces;
   forming, either on the second main surface of the crystal frame or on the inner main surface of the package base, a first step portion and a second step portion, each step portion having a designated height and being situated to serve as a respective electrode-connection site;
   forming, on each of the first and second main surfaces of the crystal vibrating piece, respective a first excitation electrode and a second excitation electrode and respective a first extraction electrode and a second extraction electrode connected to the respective excitation electrodes, the first and second extraction electrodes each having a defined thickness and extending to the outer frame;
   forming, on the inner main surface of the package base, a first connection electrode and a second connection electrode each having a defined thickness, wherein either the first and second step portions are located on the second main surface on which the first and second extraction electrodes extend onto the first and second step portions, respectively, for connection to the first and second connection electrodes, respectively, or the first and second step portions are located on the inner main surface on which the first and second connection electrodes extend onto the first and second step portions, respectively, for connection to the first and second extraction electrodes, respectively, and wherein the first and second step portions each have a height that is less than the thickness of the respective extraction electrode plus the thickness of the respective connection electrode;
   forming, on the outer main surface of the package base, a first external electrode connected to the first connection electrode and a second external electrode connected to the second connection electrode;
   aligning the package base and crystal frame in contact with each other such that each external electrode is aligned via the respective connection electrode with the respective extraction electrode, while leaving a gap between the second main surface and the inner main surface; and
   while maintaining the alignment of the package base with the crystal frame, pressing the package base and crystal frame together sufficiently to eliminate the gap while siloxane bonding the second main surface to the inner main surface.

2. The method of claim 1, wherein the step of pressing the package base and crystal frame together comprises application of compressive force from opposing respective directions on the package base and the crystal frame, respectively.

3. The method of claim 2, wherein:
   the extraction electrodes and the connection electrodes are each formed of a first layer of a first metal and a second layer of a second metal, different from the first metal, formed on the layer of the first metal; and
   during the pressing and bonding step the second metal layer of each extraction electrode becomes bonded to the second metal layer of the respective connection electrode at the respective step portion.

4. The method of claim 2, wherein forming the step portions comprises forming respective portions having either a comb-like shape or a wave-like shape.

5. The method of claim 2, wherein a width of the gap is 10% to 30% of the thickness of the respective extraction electrode plus the thickness of the respective connection electrode.

6. The method of claim 5, further comprising:
   forming a crystal lid having an inner main surface and an outer main surface;
   aligning and contacting the inner main surface of the crystal lid with the first main surface of the crystal frame; and
   siloxane bonding the crystal lid to the crystal frame.

7. The method of claim 6, wherein:
   the step of forming the crystal lid includes forming a first concavity in the inner main surface of the crystal lid;
   the step of forming the package base includes forming a second concavity in the inner main surface of the package base; and
   the alignment step includes placing the crystal vibrating piece between the first and second concavities.

8. The method of claim 2, further comprising:
   forming a crystal lid having an inner main surface and an outer main surface;
   aligning and contacting the inner main surface of the crystal lid with the first main surface of the crystal frame; and
   siloxane bonding the crystal lid to the crystal frame.

9. The method of claim 8, wherein:
   the step of forming the crystal lid includes forming a first concavity in the inner main surface of the crystal lid;
   the step of forming the package base includes forming a second concavity in the inner main surface of the package base; and
   the alignment step includes placing the crystal vibrating piece between the first and second concavities.

10. The method of claim 1, wherein a width of the gap is 10% to 30% of the thickness of an extraction electrode plus the thickness of the respective connection electrode.

11. The method of claim 10, further comprising:
forming a crystal lid having an inner main surface and an outer main surface;
aligning and contacting the inner main surface of the crystal lid with the first main surface of the crystal frame; and
siloxane bonding the crystal lid to the crystal frame.

12. The method of claim 11, wherein:
the step of forming the crystal lid includes forming a first concavity in the inner main surface of the crystal lid;
the step of forming the package base includes forming a second concavity in the inner main surface of the package base; and
the alignment step includes placing the crystal vibrating piece between the first and second concavities.

13. The method of claim 10, wherein:
the first and the second extraction electrodes and the first and the second connection electrodes are each formed of a first layer of a first metal and a second layer of a second metal, different from the first metal, formed on the layer of the first metal; and
during the pressing and bonding step the second metal layer of each extraction electrode becomes bonded to the second metal layer of the respective connection electrode.

14. The method of claim 10, wherein forming the step portions comprises forming respective portions having either a comb-like shape or a wave-like shape.

15. The method of claim 1, further comprising:
forming a crystal lid having an inner main surface and an outer main surface;
aligning and contacting the inner main surface of the crystal lid with the first main surface of the crystal frame; and
siloxane bonding the crystal lid to the crystal frame.

16. The method of claim 15, wherein:
the step of forming the crystal lid includes forming a first concavity in the inner main surface of the crystal lid;
the step of foaming the package base includes forming a second concavity in the inner main surface of the package base; and
the alignment step includes placing the crystal vibrating piece between the first and second concavities.

17. The method of claim 1, wherein:
the first and the second extraction electrodes and the first and the second connection electrodes are each formed of a first layer of a first metal and a second layer of a second metal, different from the first metal, formed on the layer of the first metal; and
during the pressing and bonding step the second metal layer of each extraction electrode becomes bonded to the second metal layer of the respective connection electrode.

18. The method of claim 1, wherein forming the step portions comprises forming respective portions having either a comb-like shape or a wave-like shape.

19. A crystal device, manufactured by a method as recited in claim 1.

20. A method for manufacturing a crystal device, comprising:
forming multiple crystal lids on a first crystal wafer having a first main surface and a second main surface;
forming multiple crystal frames on a second crystal wafer having first and second main surfaces, each crystal frame including a crystal vibrating piece and an outer frame surrounding and supporting the crystal vibrating piece, each crystal vibrating piece including at least one excitation electrode and at least one extraction electrode connected to the excitation electrode, the at least one extraction electrode having a defined thickness;
forming multiple crystal package bases on a third crystal wafer having a first main surface and a second main surface, each crystal package base corresponding to a respective crystal frame and to a respective lid on the second and first crystal wafers, respectively, to represent a respective crystal device;
on the second main surface of the second crystal wafer or on the first main surface of the third crystal wafer, forming at least one step portion for each crystal device, each step portion having a designated height and being situated to serve as a respective electrode-connection site for the respective crystal device;
on the third crystal wafer and for each crystal device, forming at least one connection electrode on the first main surface and forming at least one external electrode, corresponding to the connection electrode, on the second main surface, each connection electrode having a respective defined thickness, wherein either the step portions are located on the second main surface of the second crystal wafer on which the extraction electrodes extend onto respective step portions, or the step portions are located on the first main surface of the third crystal wafer on which the connection electrodes extend onto respective step portions, wherein the step portions each have a height that is less than the thickness of the respective extraction electrode plus the thickness of the respective connection electrode;
layering the first crystal wafer, the second crystal wafer, and the third crystal wafer relative to and in alignment with each other such that the second crystal wafer is sandwiched between the second main surface of the first crystal wafer and the first main surface of the third crystal wafer, each lid is aligned with a respective crystal frame, each crystal frame is aligned with a respective package base, and each external electrode is aligned via the respective connection electrode with the respective extraction electrode, while leaving a gap between the second main surface of the second crystal wafer and the first main surface of the third crystal wafer;
while maintaining the alignment of the wafers, pressing the wafers together-sufficiently to eliminate the gap while siloxane bonding the wafers together, thereby forming multiple crystal devices; and
detaching the crystal devices from the bonded wafers to separate the crystal devices.

21. The method of claim 20, wherein the width of the gap is 10% to 30% of the thickness of the respective extraction electrode plus the thickness of the respective connection electrode.

22. Crystal devices produced by a method as recited in claim 20.

* * * * *